United States Patent
Yan et al.

(10) Patent No.: US 8,928,046 B2
(45) Date of Patent: Jan. 6, 2015

(54) TRANSISTOR AND METHOD OF FABRICATING THE SAME

(75) Inventors: Jing-Yi Yan, Hsinchu County (TW); Chu-Yin Hung, Hsinchu (TW); Hsiao-Chiang Yao, Kaohsiung (TW); Yen-Yu Wu, Taichung (TW); Yen-Shih Huang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 162 days.

(21) Appl. No.: 12/903,220

(22) Filed: Oct. 13, 2010

(65) Prior Publication Data
US 2011/0254061 A1 Oct. 20, 2011

(30) Foreign Application Priority Data
Apr. 16, 2010 (TW) ................. 99111954 A

(51) Int. Cl.
| | | |
|---|---|---|
| *H01L 29/76* | (2006.01) | |
| *H01L 29/66* | (2006.01) | |
| *H01L 27/12* | (2006.01) | |
| *H01L 29/417* | (2006.01) | |
| *H01L 29/786* | (2006.01) | |
| *H01L 27/32* | (2006.01) | |

(52) U.S. Cl.
CPC ...... *H01L 29/66742* (2013.01); *H01L 27/1225* (2013.01); *H01L 29/41733* (2013.01); *H01L 29/78618* (2013.01); *H01L 29/7869* (2013.01); *H01L 27/3262* (2013.01)
USPC .......................................... 257/288; 438/197

(58) Field of Classification Search
CPC ............. H01L 27/1225; H01L 27/3262; H01L 29/7869; H01L 29/66742; H01L 29/78618; H01L 29/41733
USPC ............ 257/288, E29.255, E21.409; 438/197
See application file for complete search history.

(56) References Cited

U.S. PATENT DOCUMENTS

| 5,648,662 | A | 7/1997 | Zhang et al. |
| 6,653,159 | B2 | 11/2003 | Wu |
| 2006/0079034 | A1* | 4/2006 | Hoffman et al. ............... 438/151 |
| 2007/0272922 | A1 | 11/2007 | Kim et al. |
| 2008/0296568 | A1 | 12/2008 | Ryu et al. |
| 2008/0315193 | A1 | 12/2008 | Kim et al. |

(Continued)

FOREIGN PATENT DOCUMENTS

| JP | 5218418 | 8/1993 |
| JP | 2002110992 | 4/2002 |

(Continued)

OTHER PUBLICATIONS

"First Office Action of China Counterpart Application", issued on Aug. 1, 2012, p. 1-13, in which the listed references were cited.

(Continued)

*Primary Examiner* — Shaun Campbell
(74) *Attorney, Agent, or Firm* — Jianq Chyun IP Office

(57) ABSTRACT

A transistor including a gate, an active stacked structure, a dielectric layer, a source and a drain. The gate is located over a first surface of the dielectric layer. The active stacked structure, including a first active layer and a second active layer, is located over a second surface of the dielectric layer. The source and the drain are located over the second surface of the dielectric layer and at two sides of the active stacked structure and extend between the first active layer and the second active layer of the active stacked structure.

38 Claims, 19 Drawing Sheets

(56) References Cited

U.S. PATENT DOCUMENTS

2009/0050884 A1 2/2009 Ye
2009/0057663 A1 3/2009 Kim et al.
2010/0065842 A1 3/2010 Yamazaki et al.
2010/0230763 A1* 9/2010 Sun et al. ............... 257/390
2010/0264412 A1* 10/2010 Yamazaki et al. ........ 257/43
2011/0108835 A1* 5/2011 Kim et al. ............... 257/43

FOREIGN PATENT DOCUMENTS

TW 200840108 10/2008
TW 201001778 1/2010
TW 201108417 3/2011
WO 2009028453 3/2009

OTHER PUBLICATIONS

"Second Office Action of China Counterpart Application", issued on Mar. 19, 2013, p. 1-10, in which the listed references were cited.
"Office Action of Taiwan Counterpart Application", issued on Oct. 16, 2013, p. 1-8, in which the listed references were cited.
"Office Action of China Counterpart Application", issued on Sep. 26, 2013, p. 1-12, in which the listed reference was cited.

* cited by examiner

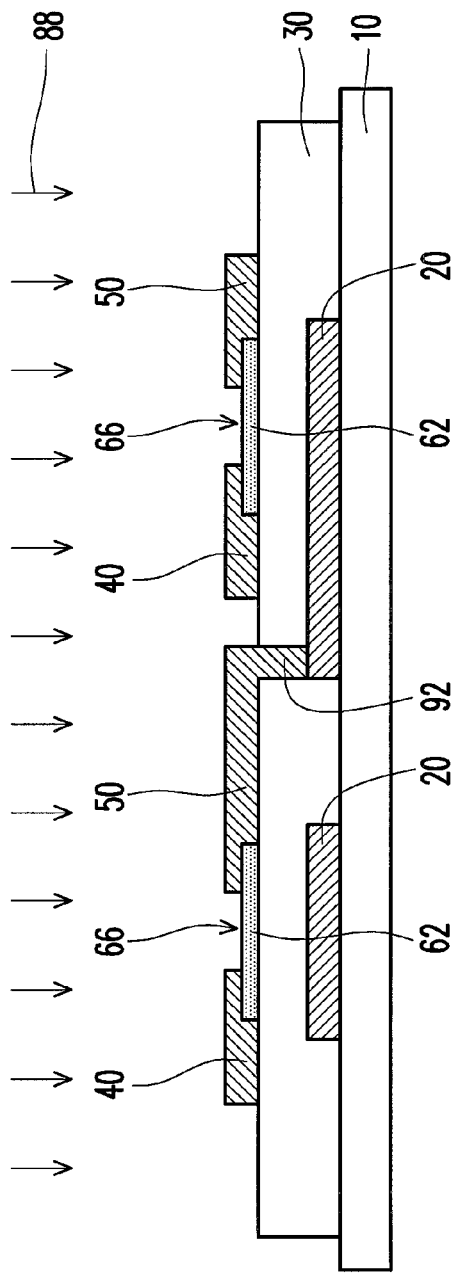
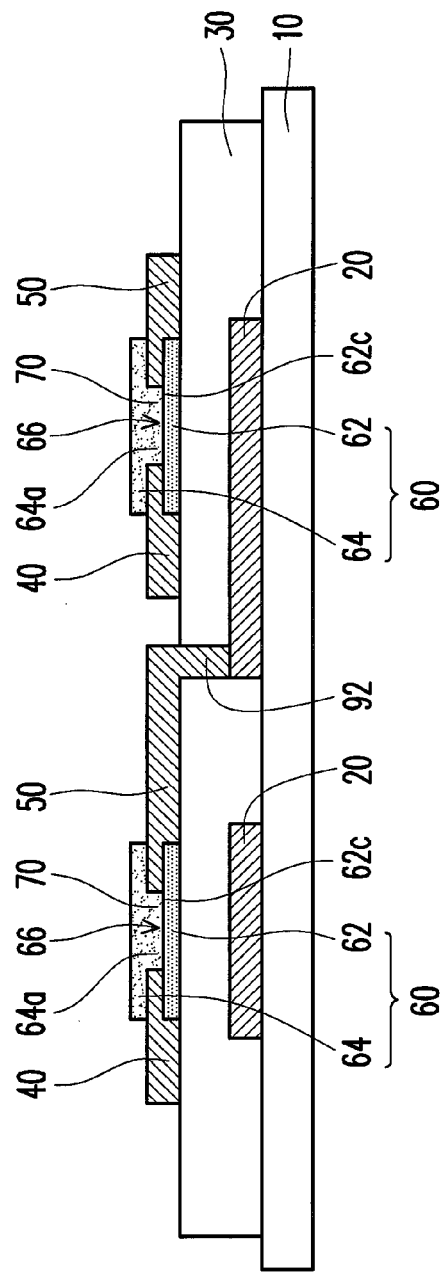

TRANSISTOR AND METHOD OF FABRICATING THE SAME

CROSS-REFERENCE TO RELATED APPLICATION

This application claims the priority benefit of Taiwan application serial no. 99111954, filed on Apr. 16, 2010. The entirety of the above-mentioned patent application is hereby incorporated by reference herein and made a part of this specification.

BACKGROUND

1. Technical Field

The disclosure relates a transistor and a method for manufacturing a transistor.

2. Description of Related Art

The oxide transistor devices have excellent device characteristic and uniformity and are suitable for the manufacturing process of large area and low temperature so that a lot of manufactures focus on the development of the oxide transistor devices. Although the oxide transistor possesses excellent device characteristics, it is easy affected by the external environment and the manufacturing process due to the material system. Typically, in the process of forming the source and the drain of the oxide transistor device with the inverted stagger structure or the coplanar structure, the channel is damaged in the electrode etching step. Hence, the stability of the device is poor. Generally, the method for solving the above problem is to form a channel protection layer over the surface of the active layer before the metal layer for forming the source and the drain is deposited. In U.S. Pat. No. 6,653,159, the channel protection layer protects the active layer from being damaged by the etching process. Another method is to remove the damaged surface of the active layer by using weak acid after the etching process has done for forming the source and the drain.

SUMMARY

A transistor is introduced herein. The transistor comprises a gate, an active stacked structure, a dielectric layer, a source and a drain. The gate is located on a first surface of the dielectric layer. The active stacked structure comprises a first active layer and a second active layer and is located on a second surface of the dielectric layer. The source and the drain are located on the second surface of the dielectric layer and at two sides of the active stacked structure respectively, wherein the source and the drain extend between the first active layer and the second active layer of the active stacked structure.

Further a method for manufacturing a transistor is introduced herein. The method comprises forming a gate on a substrate and then forming a dielectric layer on the substrate and the gate. A first active layer of an active stacked structure is formed on the dielectric layer. A source and a drain are formed on the first active layer and the dielectric layer to cover two sides of the first active layer respectively. A space is between the source and the drain to expose the first active layer. A second active layer of the active stacked structure is formed in the space and on a portion of the source and on a portion of the drain.

Also, a method for manufacturing a transistor is introduced herein. The method comprises forming a first active layer of an active stacked structure on the substrate and forming a source and a drain on the first active layer and the substrate to cover two sides of the first active layer respectively. A space is between the source and the drain and exposes the first active layer. A second active layer of the active stacked structure is formed in the space and on a portion of the source and on a portion of the drain. A dielectric layer is formed on the source, the drain, the second active layer and the substrate. A gate is formed on the dielectric layer.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIGS. 1A through 1E are cross-sectional views showing a method for manufacturing an active matrix organic light emitting diode display device having an oxide semiconductor transistor with an inverted stagger structure according to one exemplary embodiment.

DETAILED DESCRIPTION

Figure 10:
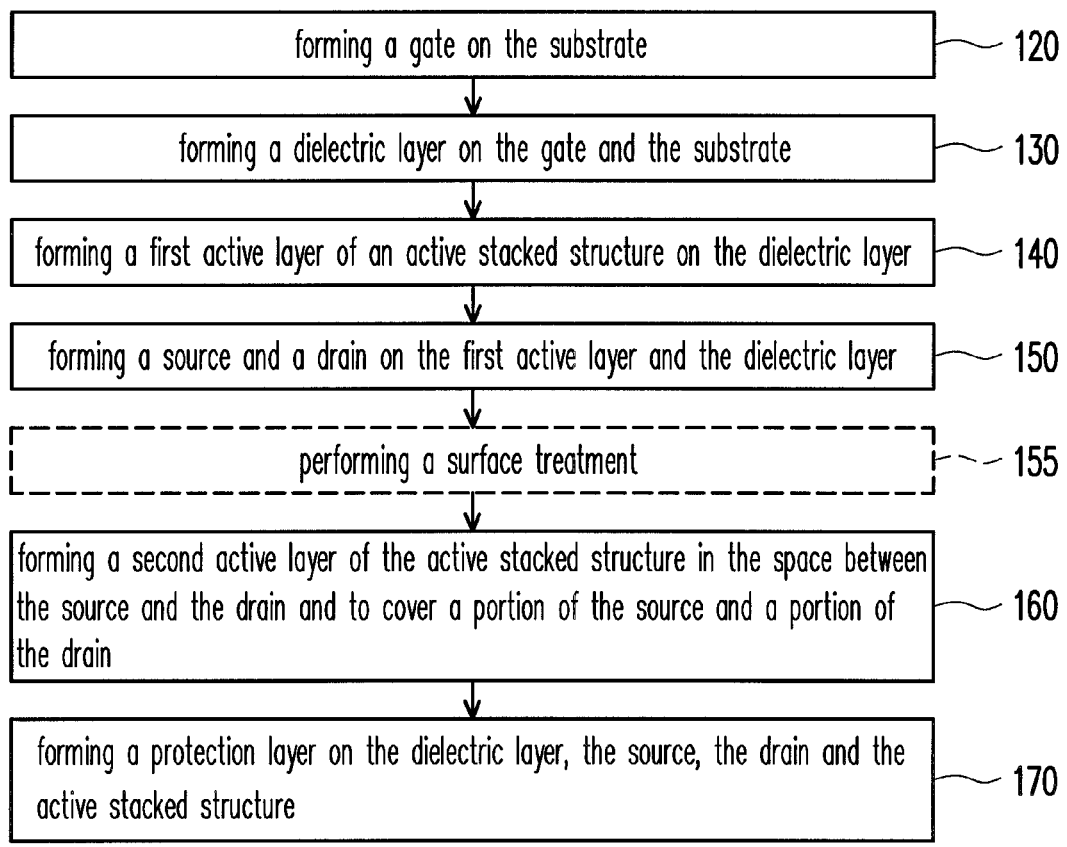
FIG. 10 is a flow chart showing the method of manufacturing the oxide semiconductor transistor with the inverted stagger structure in FIGS. 1A through 1C.

FIGS. 1A through 1E are cross-sectional views showing a method for manufacturing an active matrix organic light emitting diode display (AMOLED) device having an oxide semiconductor transistor with an inverted stagger structure according to one exemplary embodiment. FIG. 10 is a flow chart showing the method of manufacturing the oxide semiconductor transistor with the inverted stagger structure in FIGS. 1A through 1C.

As shown in FIG. 1A and FIG. 10, in the step 120, a gate 20 is formed on a substrate 10. In the step 130, a dielectric layer 30 is formed on the gate 20 and the substrate 10. In the step 140, an active layer 62 is formed on the dielectric layer 30. In the step 150, a source 40 and a drain 50 are formed on the active layer 62. The source 40 and the drain 50 are separated from each other and a space 66 is between the source 40 and the drain 50. It should be noticed that the source 40 can be exchanged with the drain 50. Under one circumstance, the element labeled 40 is the source and the element labeled 50 is the drain. Under the other circumstance, the element labeled 40 is the drain and the element labeled 50 is the source.

In the step 155, a surface treatment 88 is optionally performed so that the constituent ratio of the constituent elements of the active layer 62 is more stable. The surface treatment 88 can be, for example, a plasma process. The plasma process comprises a hydrogen plasma process, a hydrogen-containing plasma process or an oxygen-containing plasma process.

Then, as shown in FIG. 1B and FIG. 10, in the step 160, an active layer 64 is formed on the substrate 10. The active layer 64 covers the source 40 and the drain 50 and fills the space 66 so as to electrically connect to an upper surface 62c of the active layer 62. The active layers 62 and 64 together form an active stacked structure 60. A portion of the active layer 64 filling the space 66 is an extension portion 64a of the active layer 64. The extension portion 64a is located between the source 40 and the drain 50 and is used as a channel 70 of the transistor.

Figure 1C:
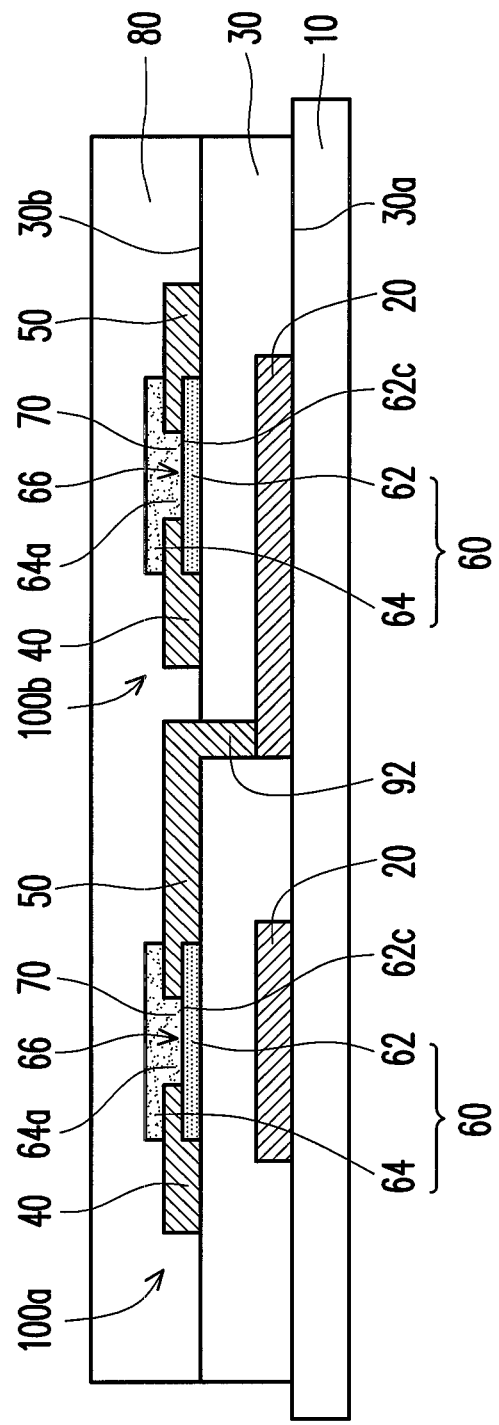

As shown in FIG. 1C, in the step 170, a protection layer 80 is formed on the substrate 10 to cover the dielectric layer 30, the source 40, the drain 50 and the active stacked structure 60 on the substrate 10 so that the oxide semiconductor transistors 100a and 100b are formed.

The gate 20 of the oxide semiconductor transistors 100a and 100b formed by the aforementioned method is located on a first surface 30a of the dielectric layer 30, and the active stacked structure 60 is located on a second surface 30b of the dielectric layer 30. The active stacked structure 60 comprises the active layer 62 and the active layer 64. The active layer 64 comprises the extension portion 64a which is in contact with the upper surface 62c of the active layer 62. The source 40 and the drain 50 are located at the periphery of the active stacked structure 60 and extend between the active layer 62 and the active layer 64 of the active stacked structure 60. The active stacked structure 60 between the source 40 and the drain 50 is used as the channel region 70. The substrate 10 is opposite to the first surface 30a of the dielectric layer 30 and covers the gate 20 and the dielectric layer 30. The protection layer 80 is opposite to the second surface 30b of the dielectric layer 30 and covers the active stacked structure 60, the source 40, the drain 50 and the dielectric layer 30.

Figure 1D:
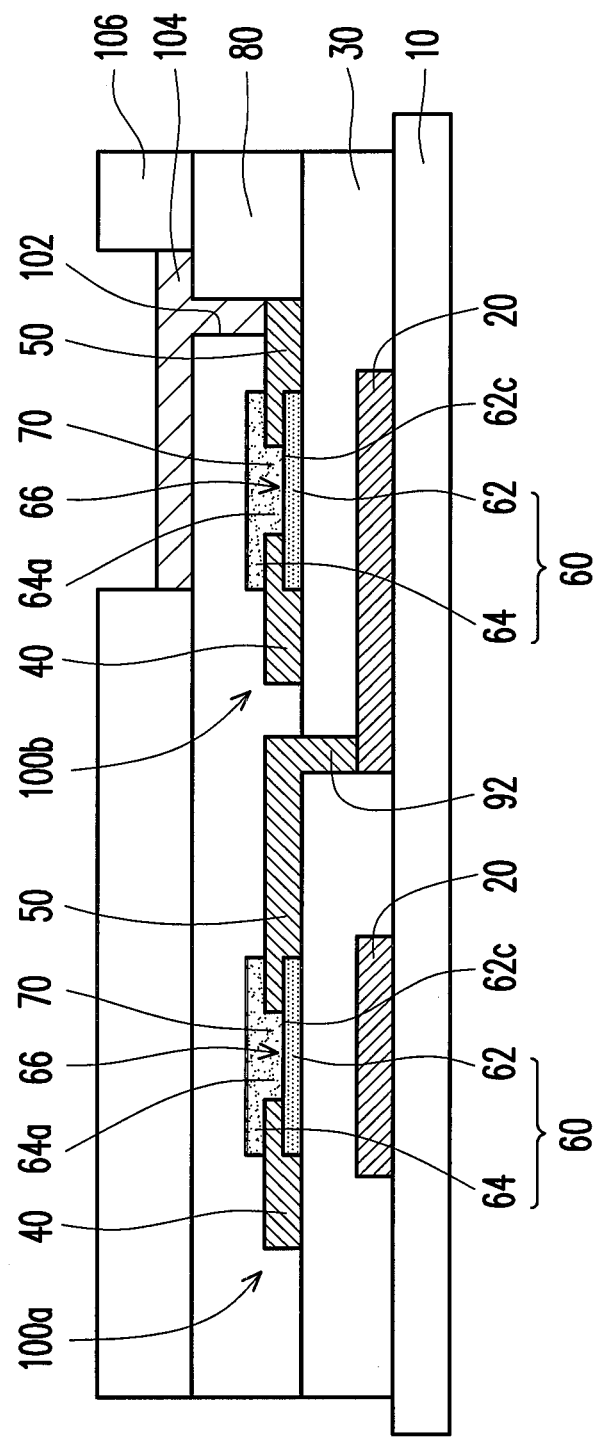

As shown in FIG. 1D, the drain 50 of the transistor 100a can be electrically connected to the gate 20 of the transistor 100b adjacent to the transistor 100a through a contact window 92.

The transistor formed by the aforementioned method can be applied according to the practical requirements. For instance, the transistor can be applied to the organic light emitting diode.

Figure 1E:
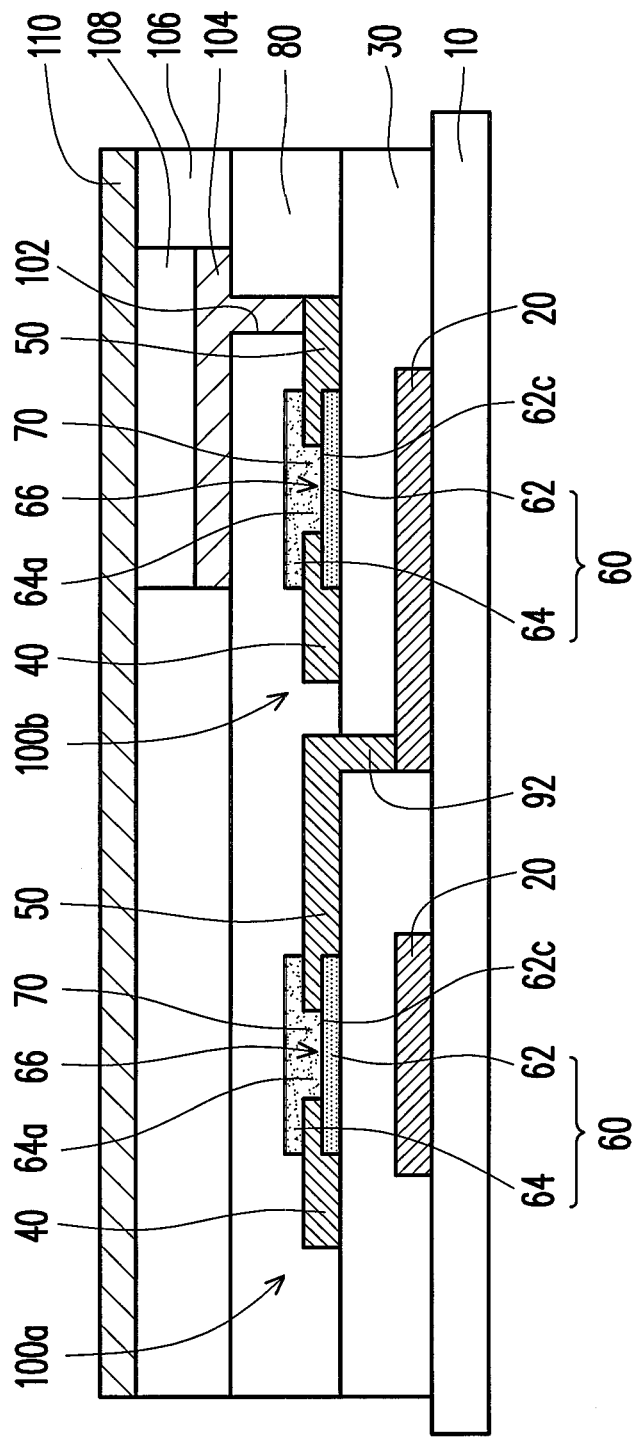

As shown in FIG. 1D, after the protection layer 80 is formed, a contact hole 102 is formed in the protection layer 80. An electrode layer 104 is formed on the protection layer 80 and fills the contact hole 102 so that the electrode layer 104 is electrically connected to the drain 50 of the transistor 100b. The electrode layer 104 is used as a pixel electrode. An insulating layer 106 is formed to surround the electrode layer 104. As shown in FIG. 1E, an organic light emitting layer 108 and an electrode layer 110 are formed on the electrode layer 104. The method for patterning the electrode layer 104 and the electrode layer 110 can be, for example, photolithographic and etching process.

Figure 2A:
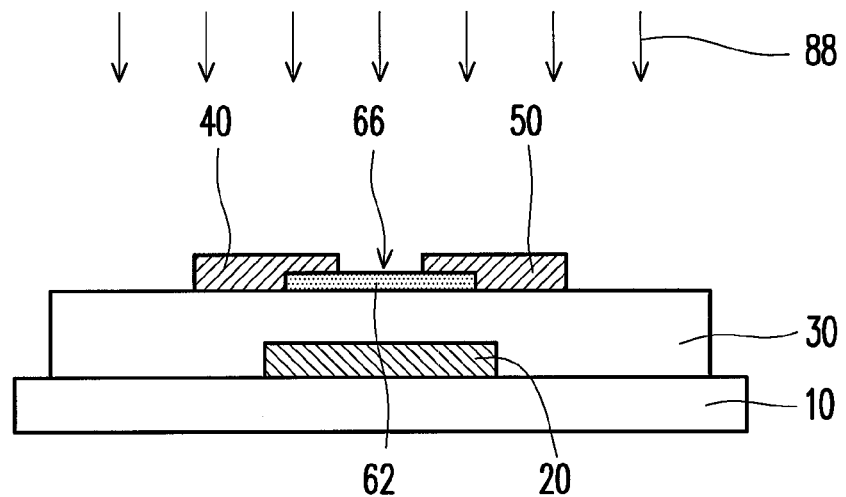
FIGS. 2A through 2C are cross-sectional views showing a method for manufacturing an oxide semiconductor transistor with an inverted stagger structure according to one exemplary embodiment.
Figure 2B:
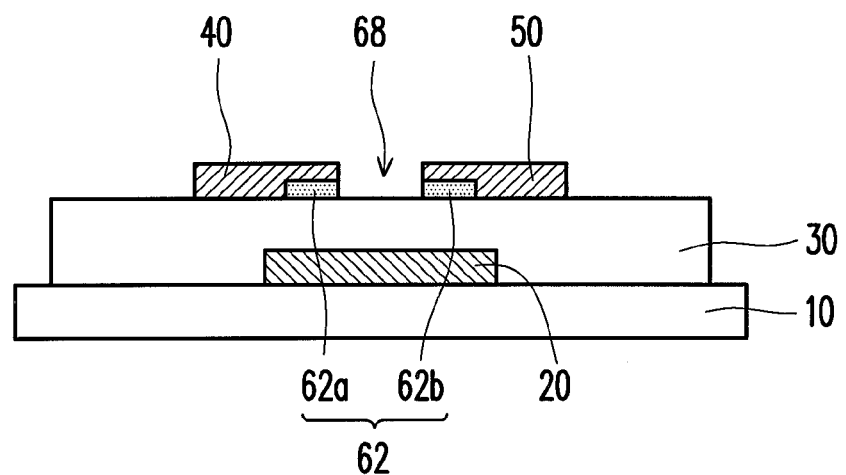
Figure 2C:
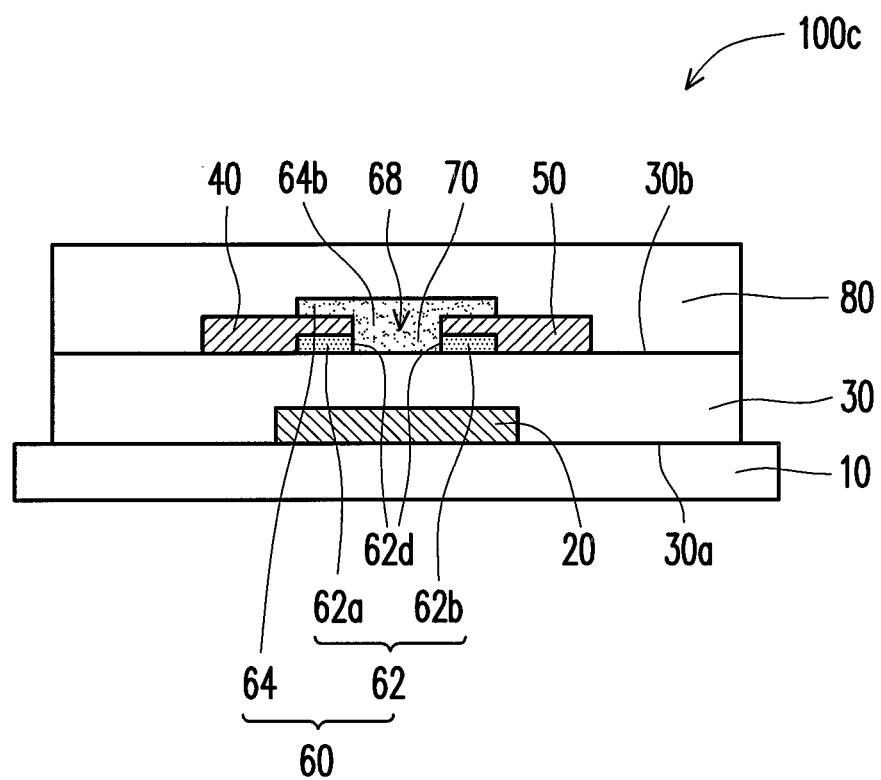

FIGS. 2A through 2C are cross-sectional views showing a method for manufacturing an oxide semiconductor transistor with an inverted stagger structure according to one exemplary embodiment.

As shown in FIG. 2A, the gate 20, the dielectric layer 30, the active layer 62, the source 40 and the drain 50 separated from the source 40 by the space 66 are formed according to the aforementioned method. Similarly, a surface treatment 88 is optionally performed so that the constituent ratio of the constituent elements of the active layer 62 is more stable.

As shown in FIG. 2B, a portion of the active layer 62 exposed by the space 66 is removed to form a space 68 with relatively large depth. The method for removing the portion of the active layer 62 can comprise, for example, performing a dry etching process or a wet etching process with the use of the source 40 and the drain 50 as etching masks to etch away the portion of the active layer 62. After the portion of the active layer 62 is removed, the space 68 divides the active layer 62 into two parts 62a and 62b so that the dielectric layer 30 is exposed by the space 68. The remaining active layer 62 overlaps the source 40 and the drain 50. The remaining active layer 62 can be the heavily doped layer, such as n+ layer or p+ layer, and is used as the ohm contact layer for reducing the contact resistance to improve the characteristic of the device.

As shown in FIG. 2C, an active layer 64 is formed on the substrate 10. The active layer 64 covers the source 40 and the drain 50 and fills the space 68 so as to electrically connect to the active layer 62. The active layer 62 and the active layer 64 together form the active stacked structure 60. A portion of the active layer 64 filling the space 68 is the extension portion 64b of the active layer 64. The extension portion 64b is located between the source 40 and the drain 50 and is used as the channel 70 of the transistor.

The protection layer 80 is formed on the substrate 10 to cover the dielectric layer 30, the source 40, the drain 50 and the active stacked structure 60 on the substrate 10.

The oxide semiconductor transistor 100c formed by the aforementioned method is similar to the aforementioned oxide semiconductor transistor 100a or 100b. The gate 20 of the oxide semiconductor transistor 100c is located on the first surface 30a of the dielectric layer 30, and the active stacked structure 60 is located on the second surface 30b of the dielectric layer 30. The substrate 10 is opposite to the first surface 30a of the dielectric layer and covers the gate 20 and the dielectric layer 30. The protection layer 80 is opposite to the second surface 30b of the dielectric layer 30 and covers the active stacked structure 60, the source 40, the drain 50 and the dielectric layer 30. The active stacked structure 60 comprises the active layer 62 and the active layer 64. However, the active layer 62 is divided into two parts 62a and 62b, and the extension portion 64b of the active layer 64 downwardly extends to be in contact with the sidewall 62d of the active layer 62.

Figure 3A:
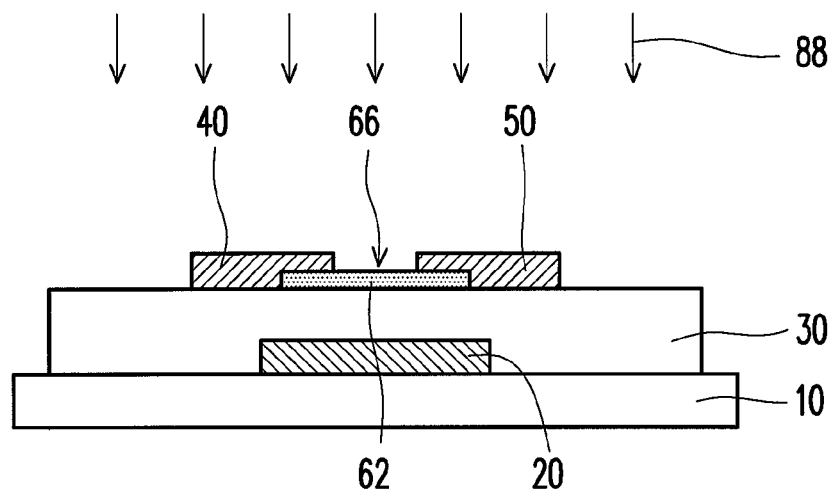
FIGS. 3A through 3C are cross-sectional views showing a method for manufacturing an oxide semiconductor transistor with an inverted stagger structure according to one exemplary embodiment.
Figure 3B:
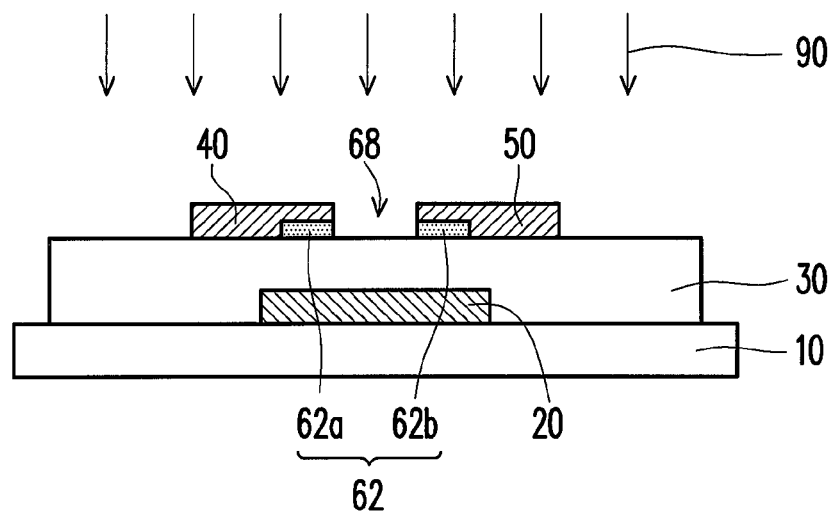
Figure 3C:
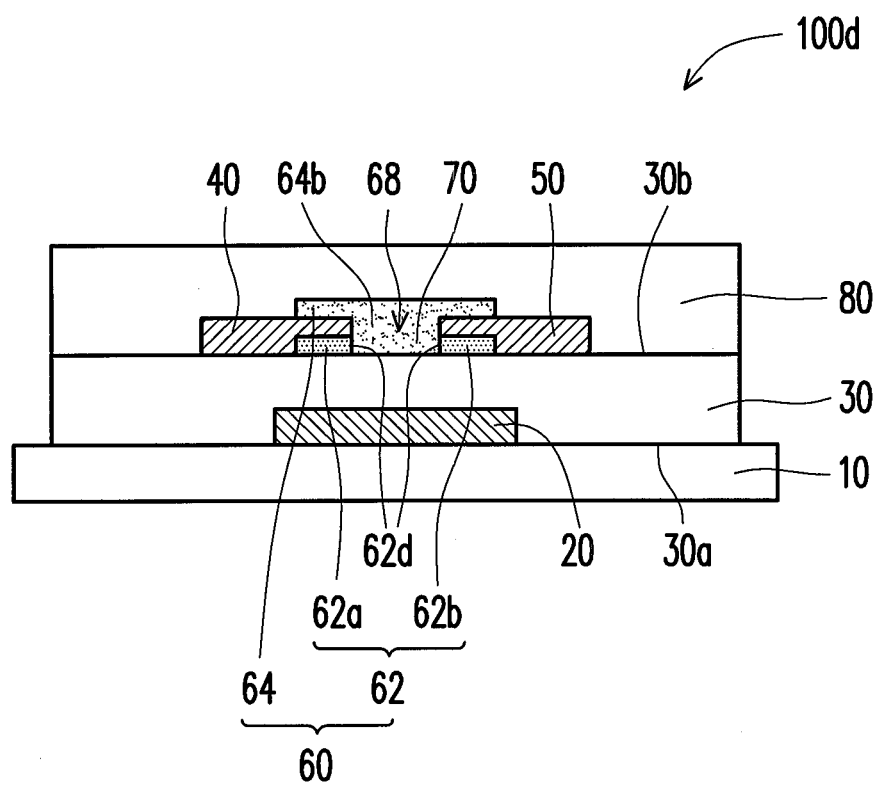

FIGS. 3A through 3C are cross-sectional views showing a method for manufacturing an oxide semiconductor transistor with an inverted stagger structure according to one exemplary embodiment.

As shown in FIG. 3A, the gate 20, the dielectric layer 30, the active layer 62, the source 40 and the drain 50 are formed according to the aforementioned method. The source 40 is separated from the drain 50 by the space 66. Similarly, the surface treatment 88 is optionally performed so that the constituent ratio of the constituent elements of the active layer 62 is more stable.

As shown in FIG. 3B, a portion of the active layer 62 exposed by the space 66 is removed to form the space 68 with relatively large depth according to the aforementioned method. Another surface treatment 90 is performed. The surface treatment 90 can be, for example, a plasma process. The plasma process comprises a hydrogen plasma process, a hydrogen-containing plasma process or an oxygen-containing plasma process. In one exemplary embodiment, the active layer 64 is made of zinc oxide, and the conductivity of the zinc oxide can be improved after the hydrogen plasma process or the hydrogen-containing plasma process is performed.

As shown in FIG. 3C, the active layer 64 is formed on the substrate 10 according to the aforementioned method. The active layer 64 covers the source 40 and the drain 50 and fills the space 68 so as to electrically connect to the active layer 62. The active layer 62 and the active layer 64 together form the active stacked structure 60. The active stacked structure 60 between the source 40 and the drain 50 is the channel region 70 of the transistor.

The protection layer 80 is formed on the substrate 10 to cover a top layer of the substrate 10. In this exemplary embodiment, the top layer comprises dielectric layer 30, the source 40, the drain 50 and the active stacked structure 60.

The structure of the oxide semiconductor transistor 100*d* formed by the aforementioned method is similar to the structure of the oxide semiconductor transistor 100*c* and is not described herein.

Figure 4A:
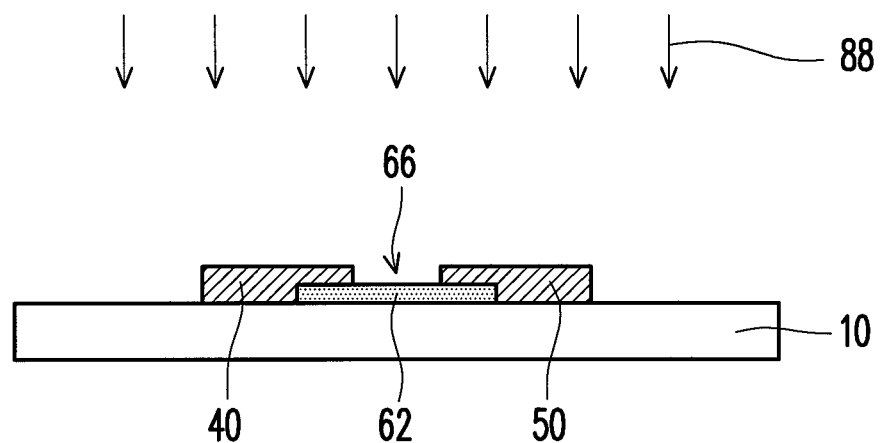
FIGS. 4A through 4C are cross-sectional views showing a method for manufacturing an oxide semiconductor transistor with a coplanar structure according to one exemplary embodiment.
Figure 4B:
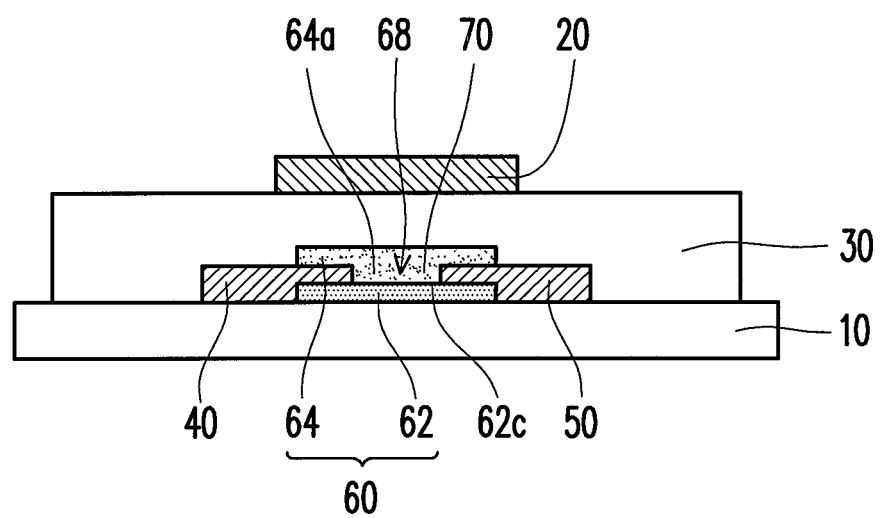
Figure 4C:
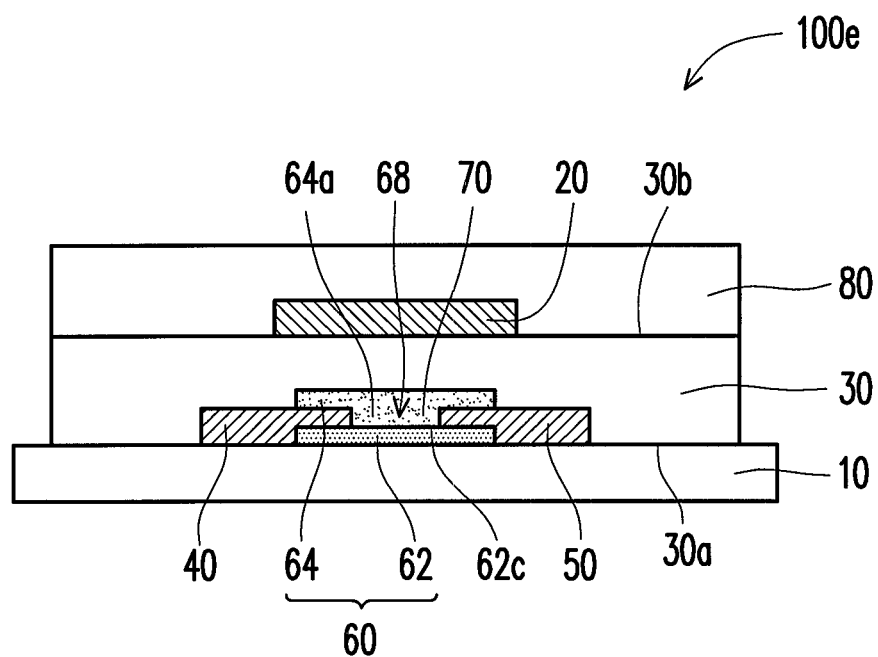
Figure 11:
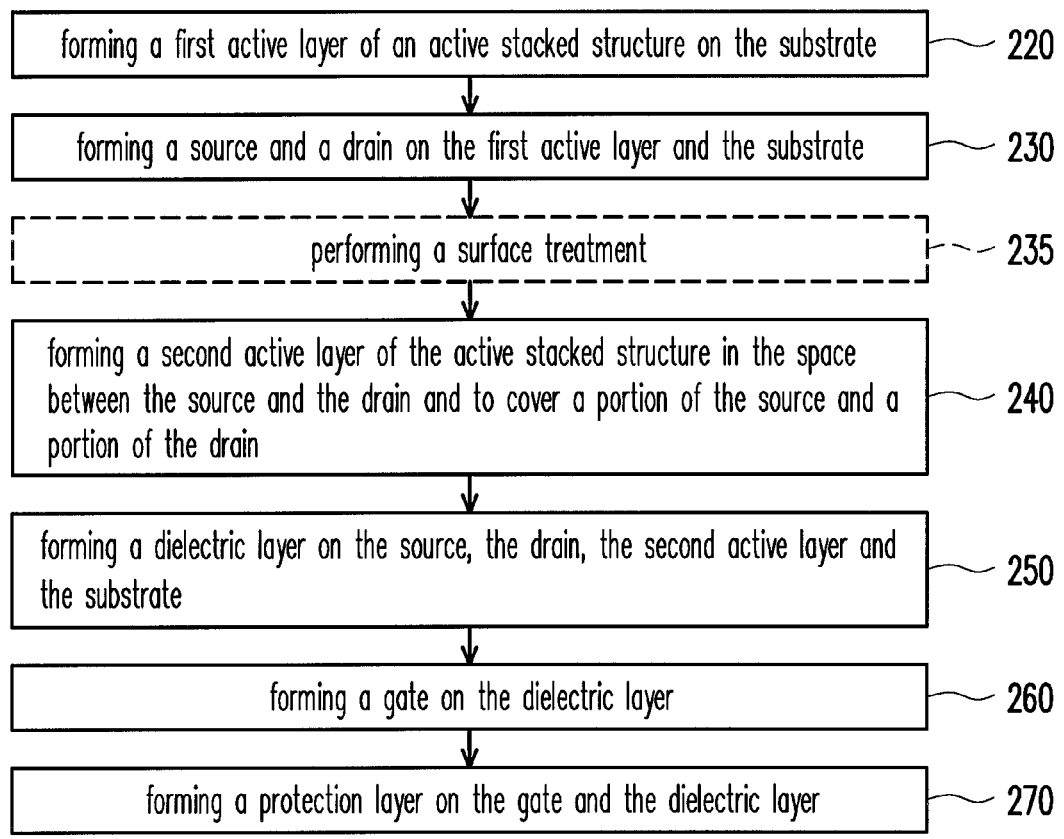
FIG. 11 is a flow chart showing the method of manufacturing the oxide semiconductor transistor with the coplanar structure in FIGS. 4A through 4C.

FIGS. 4A through 4C are cross-sectional views showing a method for manufacturing an oxide semiconductor transistor with a coplanar structure according to one exemplary embodiment. FIG. 11 is a flow chart showing the method of manufacturing the oxide semiconductor transistor with the coplanar structure in FIGS. 4A through 4C.

As shown in FIG. 4A and FIG. 11, in the step 220, the active layer 62 is formed on the substrate 10. In the step 230, a source 40 and a drain 50 are formed on the active layer 62. The source 40 and the drain 50 are separated from each other and the space 66 is between the source 40 and the drain 50. In the step 235, a surface treatment 88 is optionally performed so that the constituent ratio of the constituent elements of the active layer 62 is more stable. The surface treatment 88 can be, for example, a plasma process. The plasma process comprises a hydrogen plasma process, a hydrogen-containing plasma process or an oxygen-containing plasma process.

As shown in FIG. 4B and FIG. 11, in the step 240, the active layer 64 is formed on the substrate 10. The active layer 64 covers the source 40 and the drain 50 and fills the space 66 so as to electrically connect to the active layer 62. A portion of the active layer 62 filling the space 66 is the extension portion 64*a* of the active layer 64. The extension portion 64*b* is located between the source 40 and the drain 50 and is used as the channel 70 of the transistor. In other words, the active layer 62 and the active layer 64 together form the active stacked structure 60. The source 40 and the drain 50 are located at the periphery of the active stacked structure 60 and extend into the active stacked structure 60. The active stacked structure 60 between the source 40 and the drain 50 is used as the channel region 70.

As shown in FIG. 4C and FIG. 11, in the step 250, the dielectric layer 30 is formed on the source 40, the drain 50, the active layer 62 and the substrate 10. In the step 260, the gate 20 is formed on the dielectric layer 30. In the step 270, the protection layer 80 is formed on the substrate 10 to cover the dielectric layer 30 and the gate 20 on the substrate 10.

The gate 20 of the oxide semiconductor transistor 100*e* formed by the aforementioned method is located on the second surface 30*b* of the dielectric layer 30, and the active stacked structure 60 is located on the first surface 30*a* of the dielectric layer 30. The active stacked structure 60 comprises the active layer 62 and the active layer 64. The active layer 64 comprises the extension portion 64*a* which is in contact with the upper surface 62*c* of the active layer 62. The source 40 and the drain 50 are located at the periphery of the active stacked structure 60 and extend between the active layer 62 and the active layer 64 of the active stacked structure 60. The active stacked structure 60 between the source 40 and the drain 50 is the channel region 70. The substrate 10 is opposite to the first surface 30*a* of the dielectric layer 30 and covers the active stacked structure 60, the source 40, the drain 50 and the dielectric layer 30. The protection layer 80 is opposite to the second surface 30*b* of the dielectric layer 30 and covers the gate 20 and the dielectric layer 30.

Figure 5A:
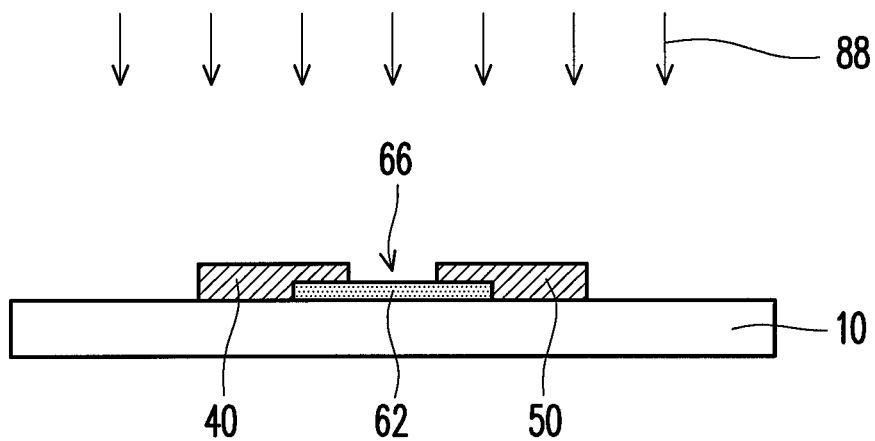
FIGS. 5A through 5C are cross-sectional views showing a method for manufacturing an oxide semiconductor transistor with a coplanar structure according to one exemplary embodiment.
Figure 5B:
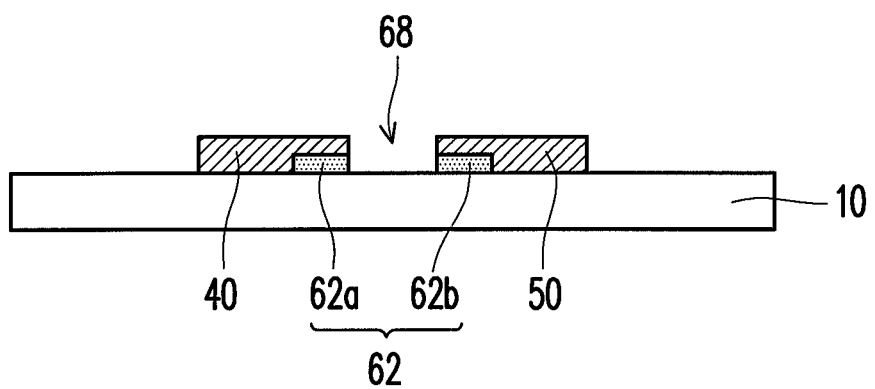
Figure 5C:
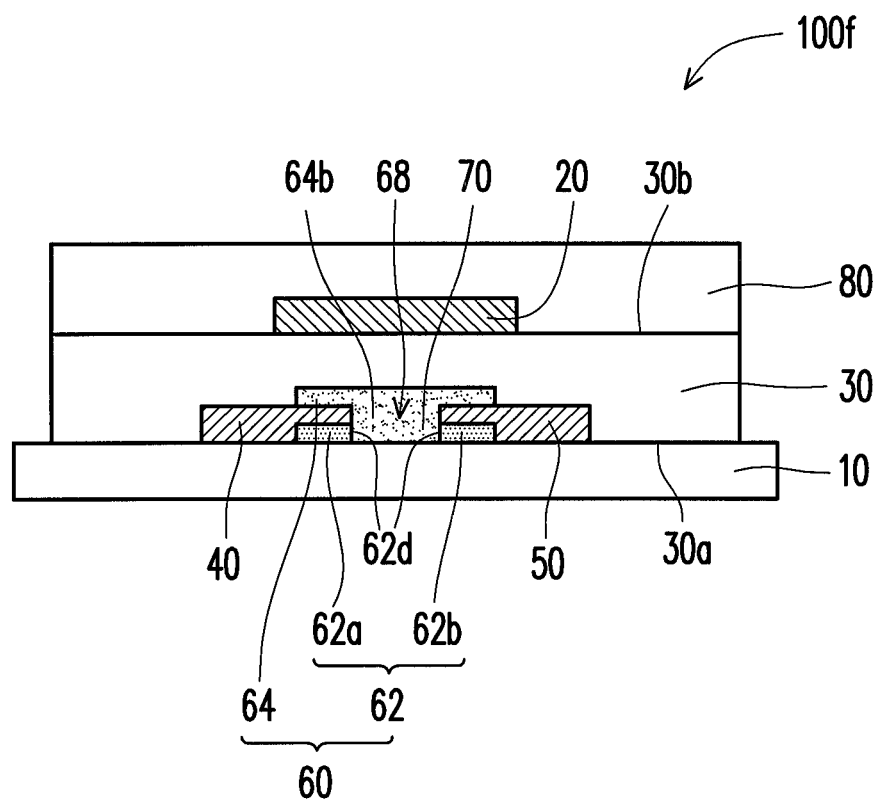

FIGS. 5A through 5C are cross-sectional views showing a method for manufacturing an oxide semiconductor transistor with a coplanar structure according to one exemplary embodiment.

As shown in FIG. 5A, the active layer 62, the source 40 and the drain 50 separated from the source 40 by the space 66 are formed on the substrate according to the aforementioned method. Similarly, the surface treatment 88 is optionally performed so that the constituent ratio of the constituent elements of the active layer 62 is more stable.

As shown in FIG. 5B, a portion of the active layer 62 exposed by the space 66 is removed to form the space 68 with relatively large depth. The space 68 divides the active layer 62 into two parts 62*a* and 62*b* so that the dielectric layer 30 is exposed by the space 68. The method for removing the portion of the active layer 62 can be the aforementioned method and is not described herein.

As shown in FIG. 5C, the active layer 64 is formed on the substrate 10. The active layer 64 covers the source 40 and the drain 50 and fills the space 68 so as to electrically connect to the active layer 62. The active layer 62 and the active layer 64 together form the active stacked structure 60. A portion of the active layer 64 filling the space 68 is the extension portion 64*b* of the active layer 64. The extension portion 64*b* is located between the source 40 and the drain 50 and is used as the channel 70 of the transistor.

The dielectric layer 30 is formed on the substrate 10 and the gate 20 is formed on the dielectric layer 30. The protection layer 80 is formed on the substrate 10 to cover the dielectric layer 30 and the gate 20 on the substrate 10.

The oxide semiconductor transistor 100*f* formed by the aforementioned method is similar to the aforementioned oxide semiconductor transistor 100*e*. The gate 20 of the oxide semiconductor transistor 100*f* is located on the second surface 30*b* of the dielectric layer 30, and the active stacked structure 60 is located on the first surface 30*a* of the dielectric layer 30. The substrate 10 is opposite to the first surface 30*a* of the dielectric layer 30 and covers the active stacked structure 60, the source 40, the drain 50 and the dielectric layer 30. The protection layer 80 is opposite to the second surface 30*b* of the dielectric layer 30 and covers the gate 20 and the dielectric layer 30. The active stacked structure 60 comprises the active layer 62 and the active layer 64. However, the active layer 62 is divided into two parts 62*a* and 62*b*, and the extension portion 64*b* of the active layer 64 downwardly extends to be in contact with the sidewall 62*d* of the active layer 62.

Figure 6A:
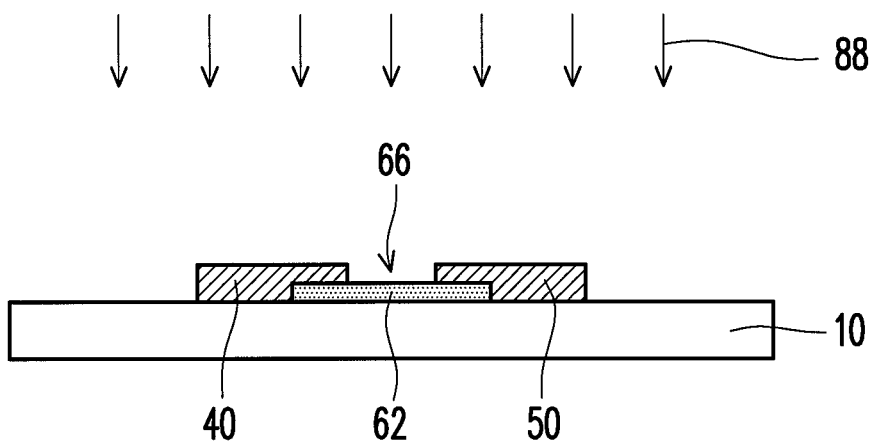
FIGS. 6A through 6C are cross-sectional views showing a method for manufacturing an oxide semiconductor transistor with a coplanar structure according to one exemplary embodiment.
Figure 6B:
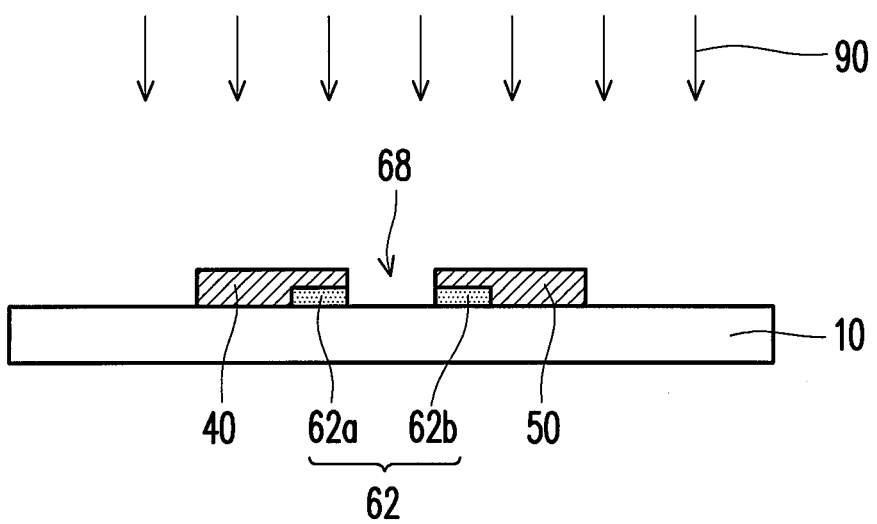
Figure 6C:
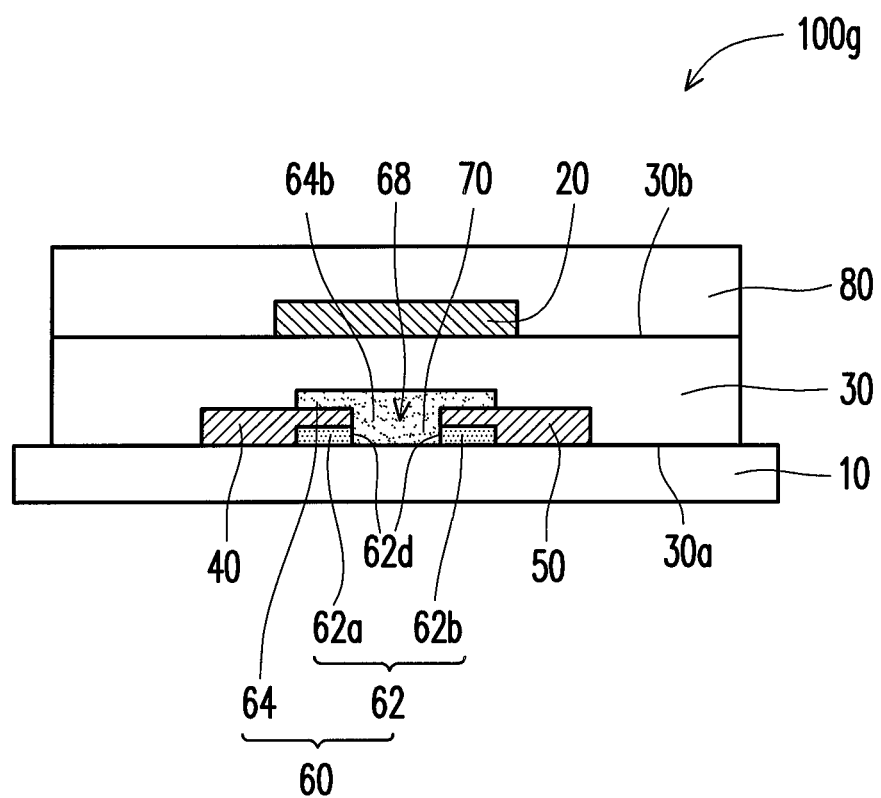

FIGS. 6A through 6C are cross-sectional views showing a method for manufacturing an oxide semiconductor transistor with a coplanar structure according to one exemplary embodiment.

As shown in FIG. 6A, the active layer 62, the source 40 and the drain 50 are formed on the substrate 10 according to the aforementioned method. The source 40 and the drain 50 are separated from each other and the space 66 is between the source 40 and the drain 50. Similarly, the surface treatment 88 is optionally performed so that the constituent ratio of the constituent elements of the active layer 62 is more stable.

As shown in FIG. 6B, a portion of the active layer 62 exposed by the space 66 is removed to form the space 68 with relatively large depth. The surface treatment 90 is performed. The surface treatment is as same as the aforementioned surface treatment and is not described herein.

As shown in FIG. 6C, the active layer 64 is formed on the substrate 10. The active layer 64 covers the source 40 and the drain 50 and fills the space 68 so as to electrically connect to the active layer 62. The active layers 62 and 64 together form the active stacked structure 60. A portion of the active layer 64 filling the space 68 is the extension portion 64b of the active layer 64. The extension portion 64b is located between the source 40 and the drain 50 and is used as the channel 70 of the transistor.

The dielectric layer 30 is formed on the substrate 10 and the gate 20 is formed on the dielectric layer 30. The protection layer 80 is formed on the substrate 10 to cover the dielectric layer 30 and the gate 20 on the substrate 10.

The structure of the oxide semiconductor transistor 100g formed by the aforementioned method is similar to the structure of the oxide semiconductor transistor 100f and is not described herein.

The substrate 10 can be, for example, a rigid substrate or a flex substrate. The rigid substrate can be, for example, a glass substrate, a silicon wafer substrate or a metal substrate. The flex substrate can be, for example, a plastic substrate or a metal foil. A material of the flex substrate is, for example, polyethylene terephthalate (PET), polyethylene naphthalate (PEN), polyester (PES), polymethylmethacrylate (PMMA), polycarbonate (PC) or polyimide (PI).

The gate 20 can be made of, for example, Au, Ag, Cu, Ni, Cr, Ti, Al, Pt, Pd or the alloy thereof. The gate 20 can have the structure of the stacked layers of Au, Ag, Cu, Ni, Cr, Ti, Al, Pt, Pd or the alloy thereof, such as titanium/aluminum/titanium or molybdenum/aluminum. The method for forming the gate 20 can be the physical vapor deposition (PVD), the chemical vapor deposition (CVD), the solution-processed deposition, the electroplating deposition, the electroless plating deposition or the method comprising forming a thin film by the other similar method and then patterning the thin film by the patterning process such as the photolithography and etching process. The method for forming the gate 20 can also comprise, for example, forming a patterned thin film by the inkjet printing process performed at low temperature.

The aforementioned dielectric layer 30 can be a single-layered structure or a multi-layered structure. The dielectric layer 30 can be made of, for example, inorganic material, organic material or the hybrid material of the inorganic material and the organic material. The inorganic material can be, for example, silicon oxide, silicon nitride or silicon oxynitride. The organic material can be, for example, Polyvinylpyrrolidone (PVP), PI, polyvinyl phenol, polystyrene (PS), acrylic or epoxy. The method for forming the dielectric layer 30 can be, for example, a chemical vapor deposition (CVD), spin coating or coating.

The method for forming the source 40 and the drain 50 comprises forming a conductive material layer and then patterning the conductive material layer. The conductive material layer can be made of, for example, metal or transparent conducting oxide. The metal can be, for example, Au, Ag, Al, Cu, Cr, Ni, Ti, Pt, Pd or the alloy thereof. Further, the metal can have the structure of the stacked layers of Au, Ag, Al, Cu, Cr, Ni, Ti, Pt, Pd or the alloy thereof, such as titanium/aluminum/titanium or molybdenum/aluminum. The method of forming the conductive material layer comprises performing a physical vapor deposition process such as a sputtering process or an evaporation process. The thickness of the conductive material layer is about 100-300 nm. The patterning method can be, for example, photolithography and etching process. In another exemplary embodiment, method for forming the source and the drain comprises directly forming a patterned conductive layer by an ink-jet process.

The active layer 62 and the active layer 64 can be made of, for example, oxide semiconductor. The oxide semiconductor layer is a common term for the material having the resistance in a range from $10^{-2}$ Ω-cm to $10^{18}$ Ω-cm. That is, the oxide semiconductor layer can be an insulator, a semiconductor or a conductor and is not limited to the semiconductor. The oxide semiconductor layer comprises two or more than two transition metals and oxygen. For instance, the oxide semiconductor layer comprises two to five transition metals and oxygen. The oxide semiconductor layer can be made of, for example, IZO(In—Zn—O), GZO(Ga—Zn—O), ZnO, GaO, IGZO(In—Ga—Zn—O) or ATZO(Al—Sn—Zn—O). The composition of the active layer 62 can be different from or as same as the composition of the active layer 64. In one exemplary embodiment, the composition and the constituent ratio of the oxide semiconductor layer of the active layer 62 are the same as the composition and the constituent ratio of the oxide semiconductor layer of the active layer 64. In another exemplary embodiment, the active layer 62 and the active layer 64 are the same in the composition but are different in the constituent ratio. For instance, the active layer 62 and the active layer 64 are both composed of IGZO, and the molar ratio of In, Ga, Zn and O of the active layer 62 is about 1:1:1:4 and the molar ratio of In, Ga, Zn and O of the active layer 64 is about 2:1:1:7. The oxide semiconductor layers having the same composition but different constituent ratios can be formed by adjusting the condition of the deposition process, such as adjusting the amount of the oxygen. The method for forming the active layer 62 and the active layer 64 can be PVD, such as the sputtering process, the evaporation process or ion beam coating, or CVD. The thicknesses of the active layer 62 and the active layer 64 can be the same or different according to the practical requirements.

The protection layer 80 can prevent the device from being exposed under the atmosphere and being damaged by the mist, the oxygen or the etching in the later process steps. The protection layer 80 can be a single-layered structure or a multi-layered structure. The protection layer 80 can be made of, for example, inorganic material, organic material or the hybrid material of the inorganic material and the organic material. The inorganic material can be, for example, silicon oxide, silicon nitride or silicon oxynitride. The organic material can be, for example, Polyvinylpyrrolidone (PVP), PI, polyvinyl phenol, polystyrene (PS), acrylic or epoxy. The method for forming the protection layer 80 can be, for example, a chemical vapor deposition (CVD) or spin coating or coating.

The electrode layer 104 and the electrode layer 110 can be, for example, transparent conducting oxide thin film, transparent metal thin film or transparent carbon nanotube (CNT).

The transparent conducting oxide can be, for example, indium tin oxide (ITO), indium zinc oxide (IZO), aluminum doped zinc oxide (AZO), or other transparent conductive materials. The transparent metal thin film can be, for example, Au, Ag, Al, Cu, Cr, Ni, Ti, Pt, Pd or the alloy thereof. The method for forming the electrode layer 104 and the electrode layer 110 comprises the sputtering process or spin-coating process. The thicknesses of the electrode layer 104 and the electrode layer 110 can be in a range, for example, from 100 nm to 500 nm.

The organic light emitting layer 108 can be made of, for example, the organic material capable of emitting red, blue, green or other monochromatic light.

Although the application of the transistor in the organic light emitting diode display device is only described by aforementioned exemplary embodiment accompanied with FIGS. 1D and 1E, all of the transistors formed by the aforementioned methods can also be applied to the organic light emitting diodes.

EXPERIMENT 1

The oxide semiconductor transistor of FIG. 1B is manufactured. The gate, the source and the drain are the MoW with thicknesses of 100 nm formed by the sputtering process. The dielectric layer is the silicon nitride with the thickness of 150 nm formed by the chemical vapor deposition. The active layer under the source and the drain is IGZO (the molar ratio of In, Ga, Zn and O is about 1:1:1:4) with the thickness of 50 nm formed by the sputtering process. The active layer above the source and the drain is IGZO (the molar ratio of In, Ga, Zn and O is about 2:1:1:7) with the thickness of 100 nm formed by the sputtering process.

Figure 7:
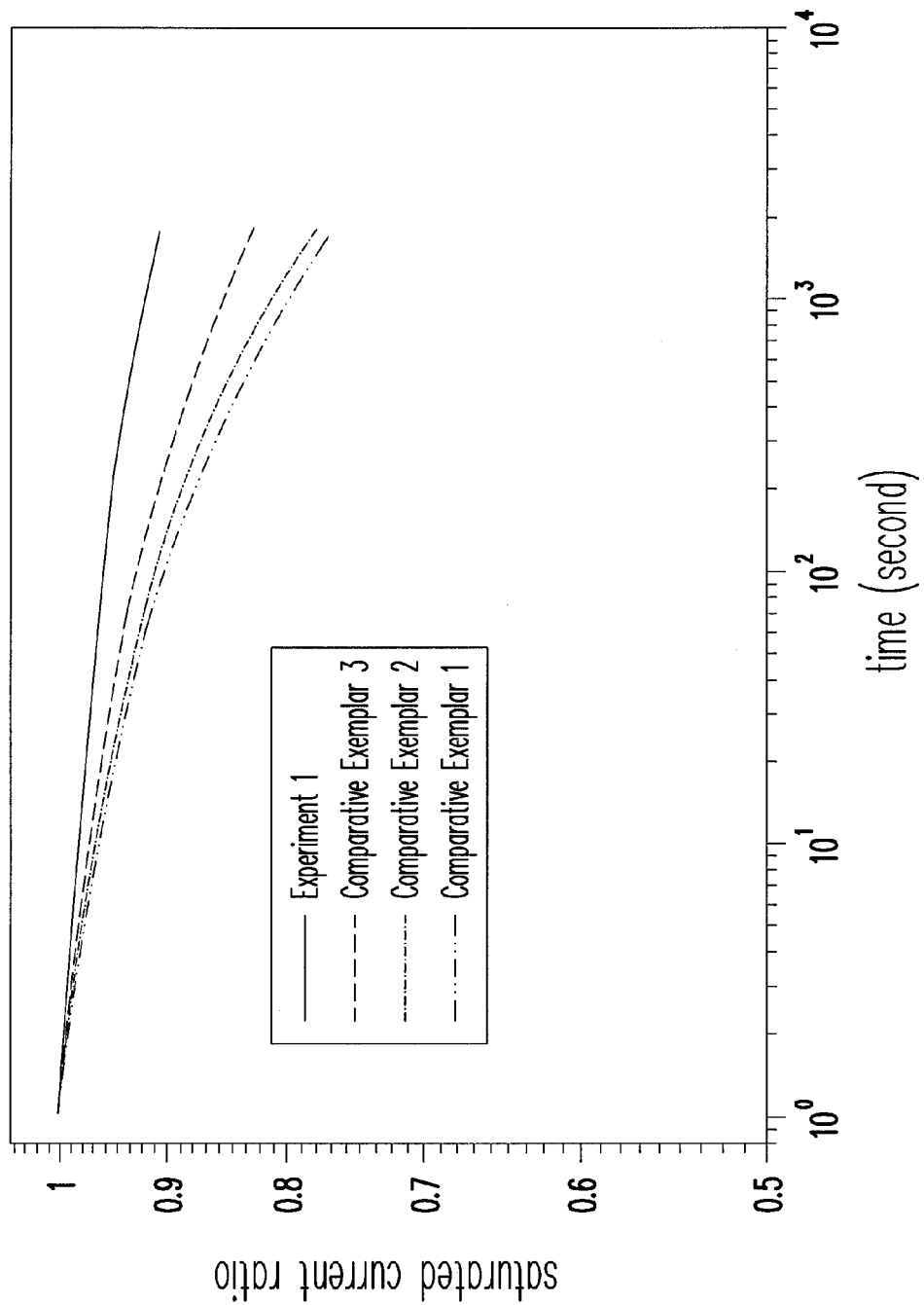
FIG. 7 shows the electric performances of the oxide semiconductor transistors of Experiment 1, a comparative exemplar 1, a comparative exemplar 2 and a comparative exemplar 3 under a test with relatively large saturated current Id and voltage Vg (i.e. Id=80 µA and Vg=20V).
Figure 8:
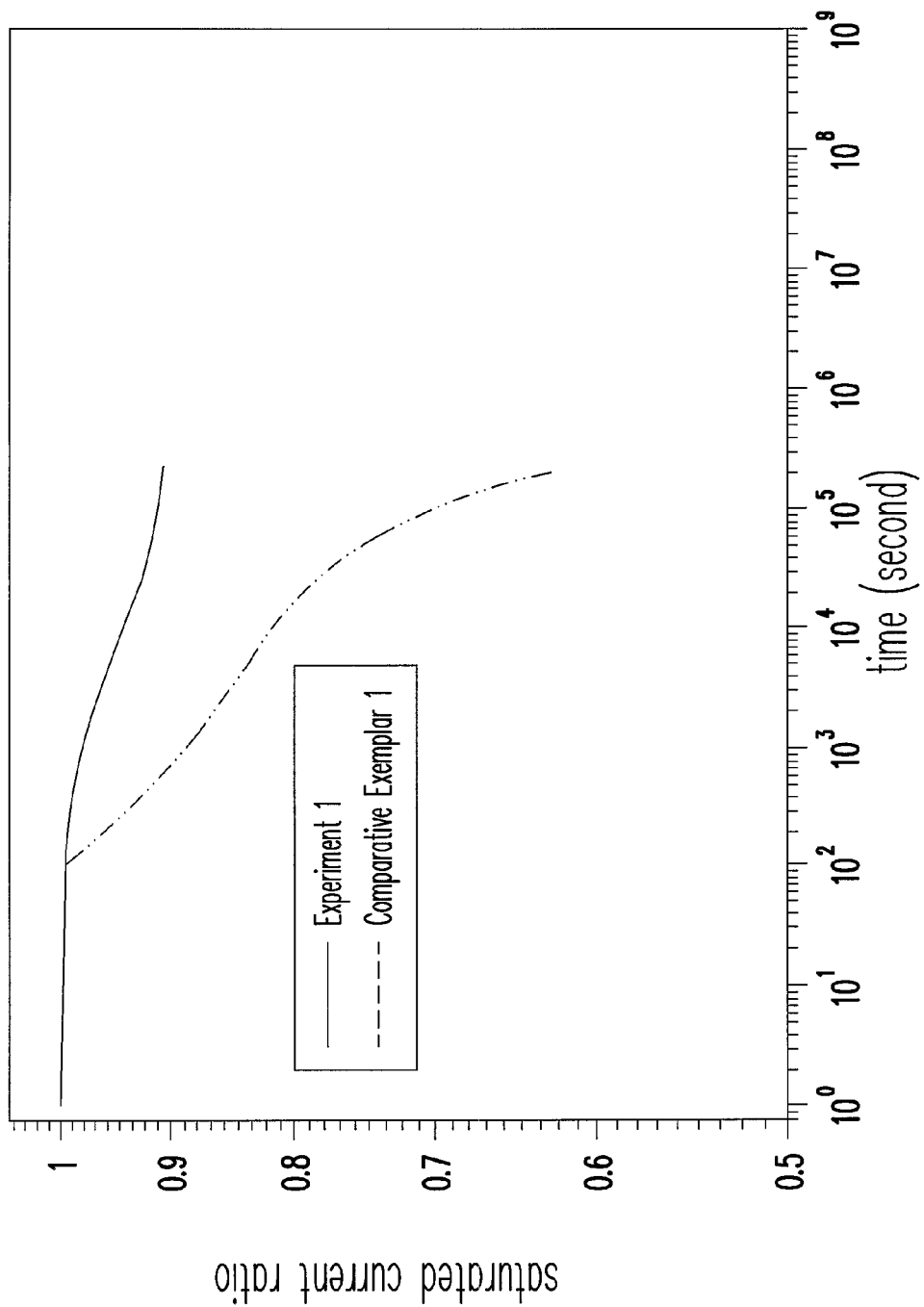
FIG. 8 shows the electric performances of the oxide semiconductor transistors of Experiment 1 and the comparative exemplar 1 under a test with a general testing condition (i.e. Id=6 µA and Vg=10V).
Figure 9:
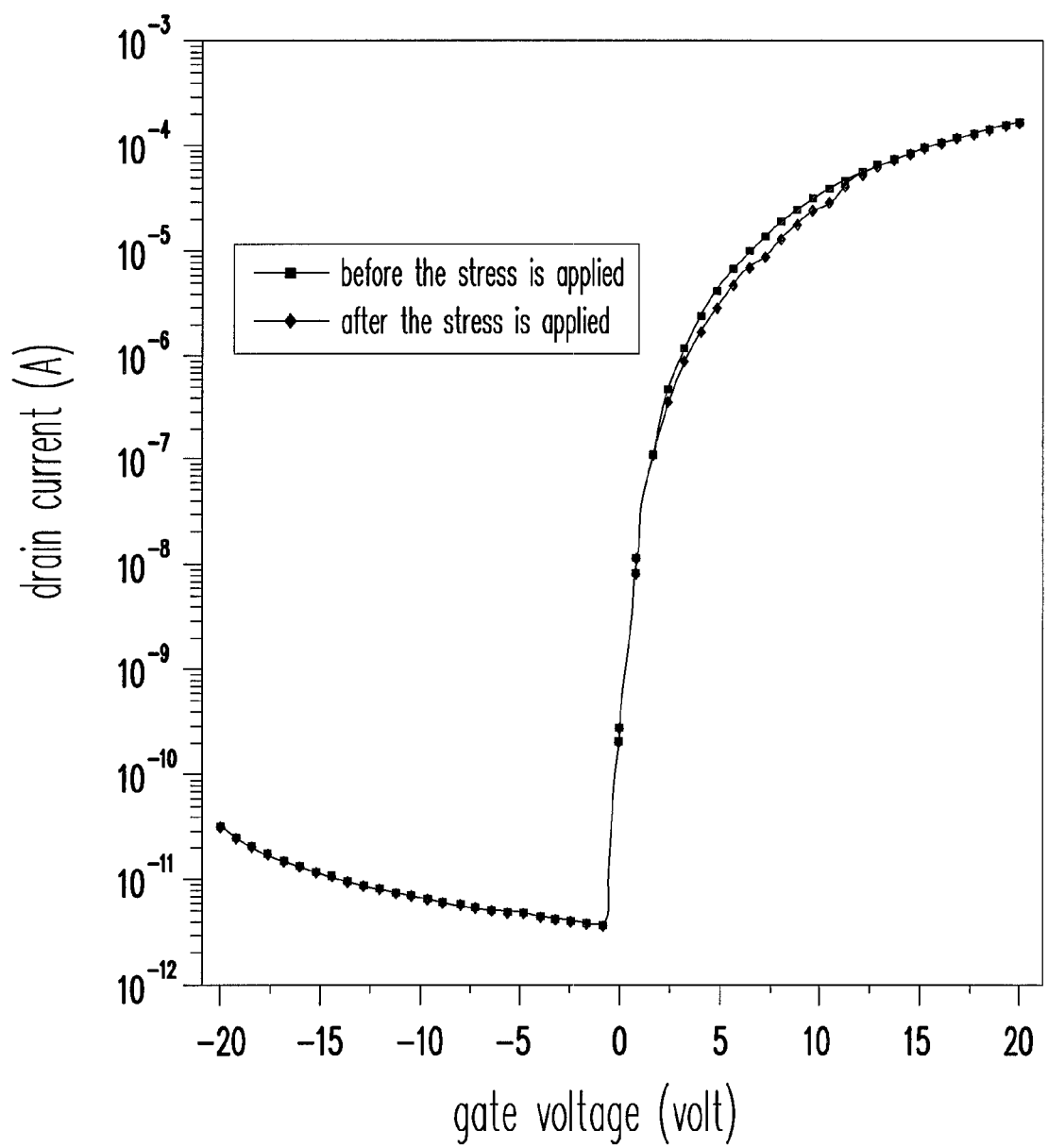
FIG. 9 shows the electric performances of the oxide semiconductor transistor of the Experiment 1 before and after the stress is applied.

A test of the electric performance is performed under different testing conditions. Under the relatively large saturated current Id and voltage Vg (i.e. Id=80 µA and Vg=20V), the testing result is shown in FIG. 7. Under a general testing condition (i.e. Id=6 µA and Vg=10V), the testing result is shown in FIG. 8. FIG. 9 shows the electric performances of the oxide semiconductor transistor of the Experiment 1 before and after the stress is applied

COMPARATIVE EXEMPLAR 1

The oxide semiconductor transistor without having the active layer above the source and the drain is formed by using the same method used in Experiment 1.

COMPARATIVE EXEMPLAR 2

The oxide semiconductor transistor without having the active layer above the source and the drain and with the 100 nm-IGZO active layer (the molar ratio of In, Ga, Zn and O is about 1:1:1:4) below the source and the drain is formed by using the same method used in Experiment 1.

COMPARATIVE EXEMPLAR 3

The oxide semiconductor transistor without having the active layer above the source and the drain and with the 200 nm-IGZO active layer (the molar ratio of In, Ga, Zn and O is about 1:1:1:4) below the source and the drain is formed by using the same method used in Experiment 1.

According to the testing results shown in FIG. 7 and FIG. 8, when the oxide semiconductor transistor is applied to the organic light emitting diode, the life time of the device is more then 3 years. Furthermore, according to the testing result shown in FIG. 9, after $2\times10^5$ seconds, the initial voltage only shifts about 0.005V which means the stability of the device is good.

According to the results of Experiment 1 and Comparative Exemplars 1 through 3, the oxide semiconductor transistor using two active layers has electric performance better than the electric performance of the oxide semiconductor transistor using single active layer. Moreover, according to the results of Experiment 1 and Comparative Exemplar 3, although the total thickness of the two active layers in Experiment 1 is smaller than the thickness of the single active layer in Comparative Exemplar 3, the electric performance of the oxide semiconductor transistor of Experiment 1 is better than the electric performance of the oxide semiconductor transistor of Comparative Exemplar 3. Thus, the electric performance improvement not just depends on the increasing of the total thickness of the active layers. Hence, the active stacked structure of the present disclosure obviously benefits the improvement of the electric performance of the device.

Altogether, the oxide semiconductor transistor in the exemplary embodiment of the present disclosure uses the active stacked structure. Without using the channel protection layer or performing the acid treatment, the stability of the device can be increased.

It will be apparent to those skilled in the art that various modifications and variations can be made to the structure of the disclosed embodiment without departing from the scope or spirit of the disclosure. In view of the foregoing, it is intended that the disclosure cover modifications and variations of this disclosure provided they fall within the scope of the following claims and their equivalents.

What is claimed is:

1. A transistor, comprising:
   a dielectric layer having a first surface and a second surface;
   a gate located on the first surface of the dielectric layer;
   an active stacked structure located on the second surface of the dielectric layer, wherein the active stacked structure is consisted of two layers including a first active layer and a second active layer, wherein the second active layer is a top layer of the active stacked structure, a material of the first active layer comprises a first semiconductor and a material of the second active layer comprises a second semiconductor, a composition of the first semiconductor and a composition of the second semiconductor are the same, and a constituent ratio of oxygen of the first semiconductor is lower than a constituent ratio of oxygen of the second semiconductor; and
   a source and a drain located on the second surface of the dielectric layer and at two sides of the active stacked structure respectively, wherein the source and the drain extend between the first active layer and the second active layer of the active stacked structure.

2. The transistor of claim 1, wherein the second active layer of the active stacked structure further comprises an extension portion separating the source from the drain and connecting to the first active layer.

3. The transistor of claim 1, further comprising a substrate opposite to the first surface of the dielectric layer and covering the gate and the dielectric layer.

4. The transistor of claim 1, further comprising a substrate opposite to the second surface of the dielectric layer and covering the active stacked structure, the source, the drain and the dielectric layer.

5. The transistor of claim 3, further comprising a protection layer opposite to the second surface of the dielectric layer and covering the active stacked structure, the source, the drain and the dielectric layer.

6. The transistor of claim 4, further comprising a protection layer opposite to the first surface of the dielectric layer and covering the gate and the dielectric layer.

7. The transistor of claim 5, wherein the protection layer is a single layer.

8. The transistor of claim 6, wherein the protection layer is a single layer.

9. The transistor of claim 5, wherein the protection layer is a stacked layer.

10. The transistor of claim 6, wherein the protection layer is a stacked layer.

11. The transistor of claim 5, wherein the material of the protection layer comprises organic material, inorganic material or hybrid material of the organic material and the inorganic material.

12. The transistor of claim 6, wherein the material of the protection layer comprises organic material, inorganic material or hybrid material of the organic material and the inorganic material.

13. The transistor of claim 2, wherein the extension portion of the second active layer further downwardly extend to divide the first active layer into two parts.

14. The transistor of claim 1, wherein the material of the first semiconductor comprises oxide semiconductor.

15. The transistor of claim 1, wherein the material of the second semiconductor comprises oxide semiconductor.

16. The transistor of claim 14, wherein the oxide semiconductor comprises two or more than two constituent elements.

17. The transistor of claim 15, wherein the oxide semiconductor comprises two or more than two constituent elements.

18. The transistor of claim 1, wherein one of the source and the drain is electrically connected to a gate of another transistor.

19. A method for manufacturing a transistor, comprising:
    forming a gate on a substrate;
    forming a dielectric layer on the gate and the substrate;
    forming a first active layer of an active stacked structure on the dielectric layer;
    forming a source and a drain on the first active layer and the dielectric layer to cover two sides of the first active layer respectively, wherein a space is between the source and the drain and the space exposes the first active layer; and
    forming a second active layer of the active stacked structure on the space to cover a portion of the source and a portion of the drain, wherein the second active layer is a top layer of the active stacked structure,
    wherein a material of the first active layer comprises a first semiconductor and a material of the second active layer comprises a second semiconductor, a composition of the first semiconductor and a composition of the second semiconductor are the same, and a constituent ratio of oxygen of the first semiconductor is lower than a constituent ratio of oxygen of the second semiconductor.

20. The method of claim 19, further comprising forming a protection layer to cover the active stacked structure, the source, the drain and the dielectric layer.

21. The method of claim 19, further comprising removing the first active layer exposed by the space so as to divide the first active layer into two parts after the source and the drain are formed.

22. The method of claim 21, further comprising performing a surface treatment after the first active layer exposed by the space is removed.

23. The method of claim 22, wherein the surface treatment comprises a plasma process.

24. The method of claim 23, wherein the plasma process comprises a hydrogen plasma process, a hydrogen-containing plasma process or an oxygen-containing plasma process.

25. The method of claim 19, further comprising performing a surface treatment on the first active layer exposed by the space.

26. The method of claim 25, wherein the surface treatment comprises a plasma process.

27. The method of claim 26, wherein the plasma process comprises a hydrogen plasma process, a hydrogen-containing plasma process or an oxygen-containing plasma process.

28. A method for manufacturing a transistor, comprising:
    forming a first active layer of an active stacked structure on the substrate;
    forming a source and a drain on the first active layer and the substrate to cover two sides of the first active layer respectively, wherein a space is between the source and the drain and the space exposes the first active layer;
    forming a second active layer of the active stacked structure in the space and to cover a portion of the source and a portion of the drain, wherein the second active layer is a top layer of the active stacked structure;
    forming a dielectric layer on the source, the drain, the second active layer and the substrate; and
    forming a gate on the dielectric layer,
    wherein a material of the first active layer comprises a first semiconductor and a material of the second active layer comprises a second semiconductor, a composition of the first semiconductor and a composition of the second semiconductor are the same, and a constituent ratio of oxygen of the first semiconductor is lower than a constituent ratio of oxygen of the second semiconductor.

29. The method of claim 28, further comprising forming a protection layer to cover the gate and the dielectric layer.

30. The method of claim 28, further comprising removing the first active layer exposed by the space so as to divide the first active layer into two parts after the source and the drain are formed.

31. The method of claim 30, further comprising performing a surface treatment after the first active layer exposed by the space is removed.

32. The method of claim 31, wherein the surface treatment comprises a plasma process.

33. The method of claim 32, wherein the plasma process comprises a hydrogen plasma process, a hydrogen-containing plasma process or an oxygen-containing plasma process.

34. The method of claim 28, further comprising performing a surface treatment on the first active layer exposed by the space.

35. The method of claim 34, wherein the surface treatment comprises a plasma process.

36. The method of claim 35, wherein the plasma process comprises a hydrogen plasma process, a hydrogen-containing plasma process or an oxygen-containing plasma process.

37. The transistor of claim 1, wherein a portion of the source and a portion of the drain are exposed by the second active layer.

38. A transistor, comprising:
    a dielectric layer having a first surface and a second surface;
    a gate located on the first surface of the dielectric layer;
    an active stacked structure located on the second surface of the dielectric layer, wherein the active stacked structure comprises a first active layer and a second active layer, wherein a material of the first active layer comprises a first semiconductor and a material of the second active layer comprises a second semiconductor, a composition of the first semiconductor and a composition of the second semiconductor are the same, and a constituent ratio of oxygen of the first semiconductor is lower than a constituent ratio of oxygen of the second semiconductor; and a source and a drain located on the second surface of the dielectric layer and at two sides of the active stacked structure respectively, wherein the source and the drain extend between the first active layer and the second active layer of the active stacked structure, the second active layer is a top layer of the active stacked structure, and a portion of a bottom portion of the second active layer is in contact with the source and the drain.

* * * * *